(12) United States Patent
Alter

(10) Patent No.: US 6,621,138 B1
(45) Date of Patent: Sep. 16, 2003

(54) ZENER-LIKE TRIM DEVICE IN POLYSILICON

(75) Inventor: Martin Alter, Los Altos, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/277,638

(22) Filed: Oct. 21, 2002

(51) Int. Cl.$^7$ .................. H01L 29/00; H01L 29/861
(52) U.S. Cl. ........................... 257/530; 257/603
(58) Field of Search .................. 257/530, 529, 257/603, 604, 605, 606

(56) References Cited

U.S. PATENT DOCUMENTS

| | | | |
|---|---|---|---|
| 4,777,471 A | 10/1988 | Comer | 341/118 |
| 5,304,802 A | * 4/1994 | Kumagai | 257/328 |
| 5,736,779 A | * 4/1998 | Kobayashi | 257/603 |
| 6,208,012 B1 | 3/2001 | Oishi | 257/565 |
| 6,242,763 B1 | * 6/2001 | Chen et al. | 257/107 |
| 6,348,716 B1 | * 2/2002 | Yun | 257/356 |
| 2001/0015461 A1 | * 8/2001 | Ebina | 257/347 |
| 2002/0137318 A1 | * 9/2002 | Peake et al. | 438/585 |

OTHER PUBLICATIONS

George Erdi, "A Precision Trim Technique for Monolithic Analog Circuits", IEEE Journal of Solid–State Circuits, vol. SC–10, No. 6, Dec. 1975, pp. 412–416.

Donald T. Comer, "Zener Zap Anti–Fuse Trim in VLSI Circuits", VLSI Design, 1996, vol. 5, No. 1, pp. 89–100.

* cited by examiner

*Primary Examiner*—Ngân V. Ngô
(74) *Attorney, Agent, or Firm*—Patent Law Group LLP; Carmen C. Cook

(57) ABSTRACT

A semiconductor device includes a polysilicon layer in which a first region of a first conductivity type and a second region of a second conductivity type is formed. The first region and the second region form a p-n junction in the polysilicon layer. The semiconductor device further includes a first metallization region in electrical contact with the first region and a second metallization region in electrical contact with the second region. In operation, a low resistance path is formed between the first and second metallization region when a voltage or a current exceeding a predetermined threshold level is applied to the first or the second region. The voltage or current is applied for zap trimming of the p-n junction where the voltage or current exceeding a predetermined threshold level, together with the resulting current or resulting voltage, provides power sufficient to cause the low resistance path to be formed.

43 Claims, 4 Drawing Sheets

ZENER-LIKE TRIM DEVICE IN POLYSILICON

FIELD OF THE INVENTION

The invention relates to zener zap devices for use in trimming circuits and, in particular, to a zener-like trim device built in polysilicon.

DESCRIPTION OF THE RELATED ART

Trimming is a technique used to improve the accuracy and yield of precision integrated circuits. Specifically, after an integrated circuit has been fabricated and tested, trimming is sometimes carried out to modify the performance of the integrated circuit. For instance, trimming may be used to adjust electrical parameters of an integrated circuit to bring those parameters to within specification. Trimming can also be done to adjust the offset voltage of an operational amplifier, or to adjust the absolute value of a reference voltage, or to fine tune the delay time in a chain of logic gates.

Widely used trimming techniques include laser trimming of thin film resistors or "zener zap" anti-fuse trimming. The zener zap trimming method has gained wide acceptance because, among other things, zener zap trimming is field programmable and is less costly to implement. Furthermore, zener zap trimming can be carried out at the wafer level or after packaging of the die. Therefore, zener zap trimming can be used to compensate for performance variations introduced by packaging of an integrated circuit.

Zener zap method uses zener diodes (also referred to as zener zap diodes) having a low to moderate breakdown voltage as the trim devices. Typically, a trim circuit includes a string of zener zap diodes and a corresponding string of resistive elements where each zener zap diode is connected in parallel with a respective one of the resistive elements. In operation, the zener zap diodes are biased so that they behave as an open circuit as fabricated. When trimming is performed, the zener zap diode is zapped and the junction is short-circuited. Typically, the resistance across the diode reduces to about 10Ω which is treated as equivalent to a "short circuit." By shorting out selective zener zap diodes and thus the associated resistive elements, a desired change in resistance value can be obtained.

In general, zener zap diodes are formed as a p-n junction of a heavily doped n+ diffusion and a moderately doped p diffusion. The doping level in the more lightly doped p-type diffusion usually determines the junction breakdown voltage. The higher the doping, the lower the breakdown voltage. For cost savings, zener zap diodes are usually constructed using existing layers and diffusions in the CMOS or bipolar fabrication process in which the diodes are to be incorporated. It is common to use the emitter-base junction of a standard NPN transistor device as the zener zap element. FIG. 1, including FIGS. 1(a) and 1(b), illustrates a conventional zener zap diode structure, as disclosed by George Erdi in, "A Precision Trim Technique for Monolithic Analog Circuits," IEEE journal of Solid-State Circuits, Vol. SC-10, No. 6, December 1975. FIG. 1(a) is a top view of the zener diode while FIG. 1(b) is a cross-sectional view of the zener diode. As shown in FIG. 1(b), conventional zener zap diodes are typically formed as NPN transistors in bulk silicon.

Conventional zener zap devices usually require zap currents of 100–200 mA for a duration of a few milliseconds to fuse the device. Currently, there has been considerable interest in trimming devices that use low zap currents, such as current values that are much less than 100 mA. Low-zap-current trim devices are of interest primarily for two reasons.

First, low-zap-current trim devices facilitate the use of a serial-register trimming scheme where the number of bond pads required to connect to the trim devices can be considerably reduced. In conventional zener zap trim circuits, at least one bond pad must be provided for each zener zap diode. When precision trimming is desired, such as a 4-bit trim, a large number of zener zap diodes (4–20) are required, making the provision of a bond pad for each diode impractical, particularly when small and low pin count packages are used. Therefore, serial-register trimming is developed where a small number of pads, such as one pad, is used to program a large number of trim devices. In the serial-register trimming scheme, the trimming circuit includes registers and a decoder for storing a serial code received at the bond pad and decoding the code to determine which of a series of zener diodes is to be zapped. Accordingly, one or a few bond pads are needed for programming a large number of zener diodes. In some cases, an existing bond pad can be used for receiving the serial input code so that no dedicated bond pads for the trimming circuit are needed.

However, when the serial-register trimming scheme is used, the same pad is often used to receive the input signals and also to receive the zap currents for programming the trim devices. Therefore, a low zap current and voltage is desired as the transistors in the decoder are typically made small and cannot handle large current or voltage. If the decoder transistors are made large so as to handle a large zap current, the decoder will consume a large amount of silicon real estate, increasing both the size and the cost of the integrated circuit.

Second, low-zap-current trimming devices also facilitate after-assembly trim for improved accuracy. After-assembly trim is preferred because any shift in device characteristics due to the assembly process can be compensated for. As a result, an integrated circuit with very precise operational parameters can be realized.

Conventional techniques to reduce the zap current of trim devices include reducing the n+ to p+ spacing of the zener diode. Variations of the geometrical shapes of the zener diode are also applied. For example, the metal contacts to the n+ and p+ diffusions are moved closer together so that the overall anode to cathode spacing is reduced. It is known that such modification allows a zener zap device built in the silicon substrate to zap at a lower current.

It is also known to form a degenerate or leaky zener where the n+ and p+ regions, formed in bulk silicon, are so closely spaced that they are actually intersected. The degenerate zener can be zapped at low currents to cause a permanent increase in the leakage current. A predetermined amount of increased leakage can be treated as a short circuit.

However, a zener zap trim device capable of being zapped at very low zap current, such as 50 mA or less, is desired.

SUMMARY OF THE INVENTION

According to one embodiment of the present invention, a semiconductor device includes a polysilicon layer formed on the top surface of and electrically isolated from a semiconductor structure, a first region of a first conductivity type formed in the polysilicon layer where the first region is heavily doped, and a second region of a second conductivity type formed in the polysilicon layer adjacent the first region where the second region is heavily doped. The first region and the second region form a p-n junction in the polysilicon layer. The semiconductor device further includes a first metallization region in electrical contact with the first region and a second metallization region in electrical contact with the second region. In operation, a low resistance path is formed between the first metallization region and the second metallization region when a voltage or a current exceeding a predetermined threshold level is applied to a selected one of the first and the second region.

In one embodiment, the voltage or current is applied for zap trimming of the p-n junction where the voltage or current exceeding a predetermined threshold level, together with the resulting current or resulting voltage, provides power sufficient to cause the low resistance path to be formed.

In another embodiment, the polysilicon layer is formed on a dielectric layer formed on the top surface of a semiconductor substrate. The polysilicon layer can be lightly doped with p-type conductivity or lightly doped with n-type conductivity or undoped.

The present invention is better understood upon consideration of the detailed description below and the accompanying drawings.

BRIEF DESCRIPTION OF THE DRAWINGS

FIGS. 1(a) and 1(b), illustrates a conventional zener zap diode structure.

DETAILED DESCRIPTION OF THE PREFERRED EMBODIMENTS

In accordance with the principles of the present invention, a trim device includes a zener-like p-n junction diode formed in a polysilicon layer overlying a dielectric layer. The trim device further includes metallization contacts to the p-type and n-type regions of the diode. The trim device of the present invention can be zapped at low zap currents, such as less than 50 mA, for forming a reliable conductive connection between the metallization contacts. Thus, the trim device of the present invention can be applied advantageously in trimming circuits requiring low zap currents, such as when the trimming circuits employ serial-register trimming. Furthermore, the trim device of the present invention can be used in both the reverse trim mode and the forward trim mode. Because the trim device of the present invention is built in a polysilicon layer isolated from the bulk silicon substrate, the trim device can be used in a forward trim mode as parasitic injection into the substrate is obviated.

Figure 1:
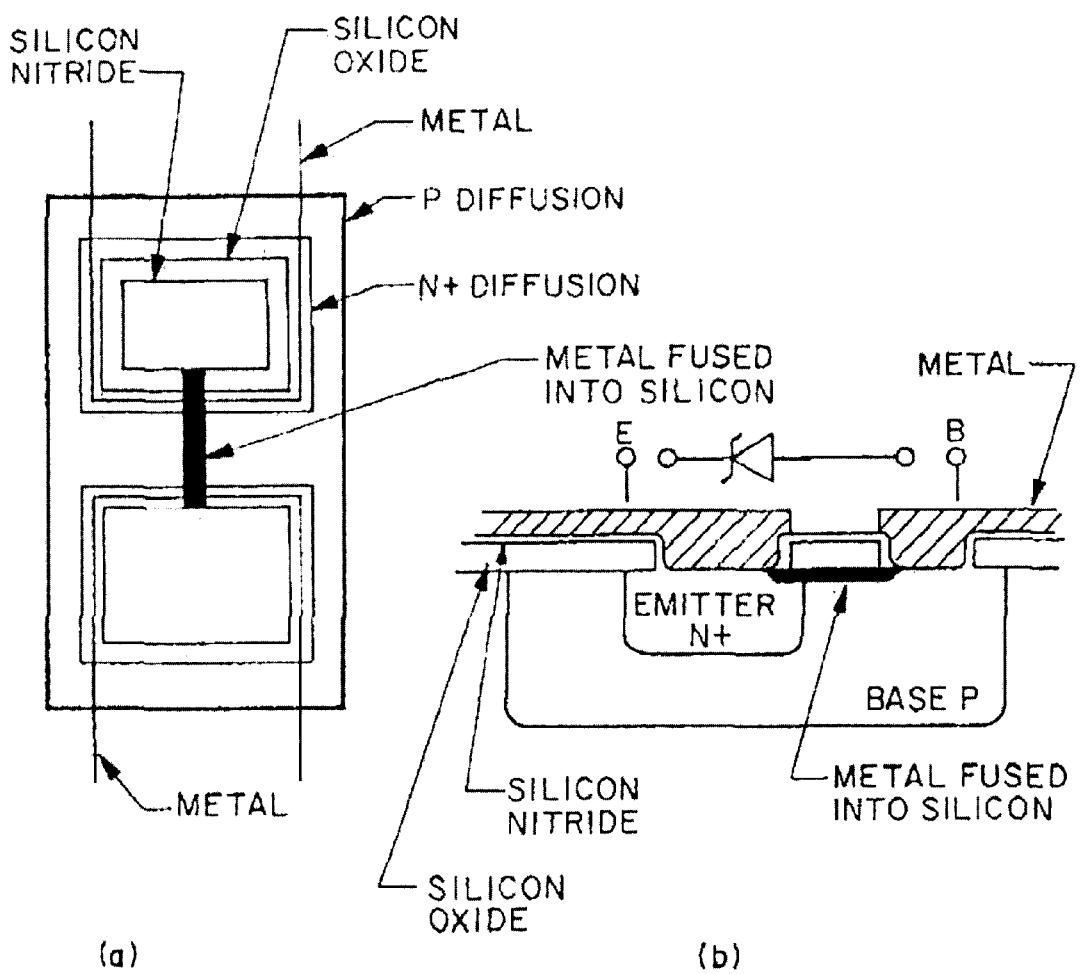
FIG. 1, including
Figure 2:
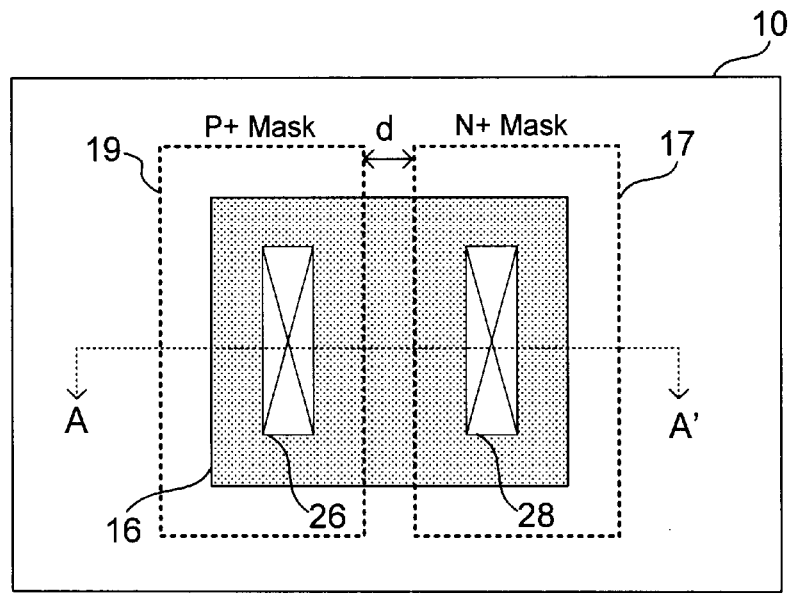
FIG. 2 is a top view of a zener-like trim device according to one embodiment of the present invention.
Figure 3:
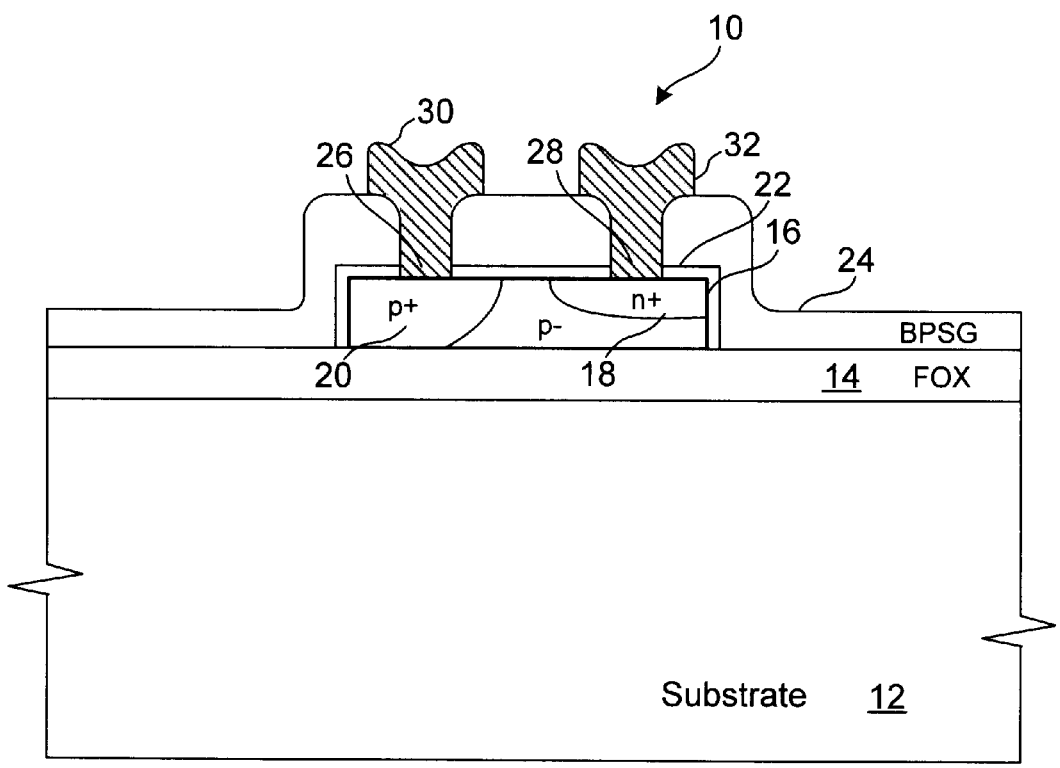
FIG. 3 is a cross-sectional view of the trim device in FIG. 2 along a line A–A'.

FIG. 2 is a top view of a zener-like trim device according to one embodiment of the present invention. A cross-sectional view of the trim device in FIG. 2 along a line A–A' is shown in FIG. 3. Layers in the top view of FIG. 2 that are the same as regions in the cross-sectional view of FIG. 3 are given the same reference numerals.

Referring to FIGS. 2 and 3, trim device 10 of the present invention is formed in a polysilicon layer 16. In the present embodiment, polysilicon layer 16 is formed on a semiconductor structure including a field oxide layer (FOX) 14 formed on the top surface of a silicon substrate 12. However, the semiconductor structure of FIG. 3 including FOX layer 14 on silicon substrate 12 on which trim device 10 is formed is illustrative only. The exact structure and arrangement of the layers underneath polysilicon layer 16 is not critical to the practice of the present invention. The only requirement is that polysilicon layer 16 is formed on a dielectric layer so that the polysilicon layer is electrically isolated from the substrate. Furthermore, the dielectric layer should have a thickness sufficient to provide adequate thermal isolation of the trim device.

In the present embodiment, substrate 12 has a thickness of about 625$\mu$, field oxide layer 14 has a thickness of about 1 $\mu$ and polysilicon layer 16 has a thickness of about 400 Å.

Polysilicon layer 16 can be formed using any conventional deposition methods, such as chemical vapor deposition, followed by patterning to define a rectangular portion of the polysilicon film as layer 16. In the present embodiment, polysilicon layer 16 is amorphous as deposited and converts to a polycrystalline film after subsequent heat treatment in the fabrication process. In other embodiments, polysilicon layer 16 can be deposited as a polycrystalline film. The advantages and disadvantages of using an amorphous film versus a polycrystalline film at deposition are well known in the art. For instance, it is generally known that an amorphous polysilicon film crystallizes in a more uniform fashion during heat treatment and therefore produces a better polycrystalline film at the conclusion of the fabrication process. However, deposition of an amorphous polysilicon film is generally more expensive than deposition of a polycrystalline polysilicon film.

The selection of a deposited amorphous film or a deposited polycrystalline film for forming polysilicon layer 16 of trim device 10 is not critical to the characteristics or the operation of the trim device. Typically, the structure of the thin films used to form trim device 10 is selected to allow trim device 10 to be fabricated using existing fabrication processes. Thus, in practice, the selection of an amorphous or a polycrystalline film is often dictated by the films that are available in an existing fabrication process in which the trim device is to be incorporated. For example, some fabrication processes include the deposition of an amorphous polysilicon layer which layer is used to form the gate terminals of field effect transistors. In that case, polysilicon layer 16 can be formed using the same amorphous polysilicon film. On the other hand, some fabrication processes include the deposition of a polycrystalline polysilicon layer. In the case, polysilicon layer 16 may be formed using the polycrystalline film. However, care must be taken to preclude the introduction of Poco doping, normally introduced in a polycrystalline-deposited film, from the portion of the polycrystalline film used to form polysilicon layer 16.

In accordance with the present invention, the resistivity of polysilicon layer 16 can be selected based on the desired magnitude of the zap current and the desired open circuit voltage for the trim device. In general, a low resistivity film is useful when low current zapping is desired since a smaller voltage will be developed across the diode during trim zapping while a high resistivity film is useful when a higher zap voltage can be tolerated across the trim device 10. Thus, polysilicon layer 16 can be a high resistivity film or a low resistivity film depending on the application. As is commonly understood by one skilled in the art, the resistivity of polysilicon layer 16 is largely determined by the doping level, or lack thereof, of the layer. In the present embodiment, polysilicon layer 16 is a lightly doped film having p-type conductivity. For instance, polysilicon layer 16 can be doped using boron subsequent to deposition of the polysilicon film.

In one embodiment, polysilicon layer 16 has a sheet resistivity of about 500 ohms/square. For instance, a given fabrication process may include a 500 ohms/square polysilicon film for forming p-type resistors in the integrated circuit. In that case, trim device 10 can use the same 500 ohms/square polysilicon film to form polysilicon layer 16. In another embodiment, polysilicon layer 16 can have a sheet resistivity of about 1500 ohms/square. In other embodiments, polysilicon layer 16 can be undoped or it can be lightly doped with n-type conductivity. As described above, the selection of the conductivity type and the doping level, and therefore the sheet resistivity, of polysilicon layer 16 can depend largely on the processing steps that are inherent in the fabrication process used to build trim device 10.

In yet another embodiment, a very low resistivity, such as about 200–300 ohms/square, in polysilicon layer 16 can be obtained by the application of an "overmask" and the introduction of additional doping to a polysilicon film having 500 or 1500 ohms/square resistivity. A very low resistivity in polysilicon layer 16 acts to reduce the voltage drop across the p-n junction of trim device 10 during trim zapping. Such an overmask can, be a dedicated processing step or the overmask can be used in an existing fabrication process for performing, for example, the body implant or the channel implant of an LDMOS transistor. When the overmask is used to perform the body implant of an LDMOS transistor, the overmask can be used to introduce p-type dopants, n-type dopants or both.

Subsequent to the formation of polysilicon layer 16, heavily doped n+ and p+ regions are formed in the polysilicon layer using conventional means. For instance, the n+ and p+ regions can be formed by ion implantation of the appropriate dopants follow by anneal. In the present embodiment, an N+ mask 17 (FIG. 2) is applied to define an area in polysilicon layer 16 for receiving an n+ implant, such as arsenic. On the other hand, a P+ mask 19 (FIG. 2) is applied to define an area in polysilicon layer 16 for receiving a p+ implant, such as boron. After implantation and anneal, an n+ region 18 and a p+ region 20 are formed in polysilicon layer 16. In the present embodiment, P+ mask 19 and N+ mask 17 are separated by a spacing "d" of 0.6μ. Thus, the resulting p+ and n+ regions are also separated by a spacing of about 0.6μ. The n+ region and p+ region in polysilicon layer 16 form a p-n junction which functions as a zener diode for zap trimming using trim device 10.

The dose and the depth of n+ and p+ regions can be selected to be compatible with existing fabrication processes. For example, in the present embodiment, p+ region 20 is formed using the same implantation step for forming p+ active regions of a PMOS transistor in the bulk silicon. The same implantation step as applied to the polysilicon layer is also used to convert a p– doped polysilicon layer to a p+ doped polysilicon layer so that the p+ doped polysilicon layer can be used as the top plate of a poly-poly capacitor. Thus, in the present embodiment, p+ region 20 has a junction depth that extends to the entire thickness of polysilicon layer 16. On the other hand, n+ region 18 is formed using the same implantation step for forming n+ active regions of an NMOS transistor in the bulk silicon. In the present embodiment, the n+ region is formed using arsenic as dopants and has a junction depth that extends only partially into polysilicon layer 16.

It is instructive to note that the precise values of the junction depths of p+ region 20 and n+ region 18 are not critical to the operation of trim device 10 as long as the n+ and p+ junctions are of sufficient depth to support normal diode action. In other embodiments, the junction depths of the p+ and n+ regions can be tailored to obtain the desired diode characteristics.

Subsequent to the formation of n+ region 18 and p+ region 20, polysilicon layer 16 is encapsulated with a dielectric layer. In the present embodiment, an oxide layer 22 of about 1000 Å is first grown on polysilicon layer 16, then, a BPSG layer 24 of about 1μ is deposited over the polysilicon layer and the oxide layer. Contact openings to the p+ and n+ regions in polysilicon layer 16 are then made through BPSG layer 24 and the oxide layer 22. Specifically, a contact opening 26 is made to p+ region 20 and a contact opening 28 is made to n+ region 18. A metallization process is then carried out to form a metal interconnect 30 to the p+ region and a metal interconnect 32 to the n+ region. Typically, aluminum is used as the metal interconnects. Metal interconnects 30, 32 are used to electrically connect the anode (p+) and cathode (n+) of the zener diode to their respective nodes in a trim circuit.

Trim device 10, as formed by the above process and illustrated in FIG. 3, is a zener-like trim device which can be used as trim elements in zener zap trimming circuits. That is, trim device 10 can be considered an open circuit as formed that can be programmed or zapped by the application of voltage and sufficient zap current at the cathode or anode terminal of the trim device. In particular, a zap current can be applied during trimming that results in a sufficiently high voltage being developed across the p-n junction of the trim device. Alternatively, a zap voltage can be applied during trimming that results in a sufficiently high current being caused to flow across the p-n junction of a trim device. Essentially, the application of current with the resulting voltage or the application of voltage with the resulting current has to supply enough power (that is, voltage times current) beyond a threshold power level to cause the trim device to be zapped.

Figure 6:
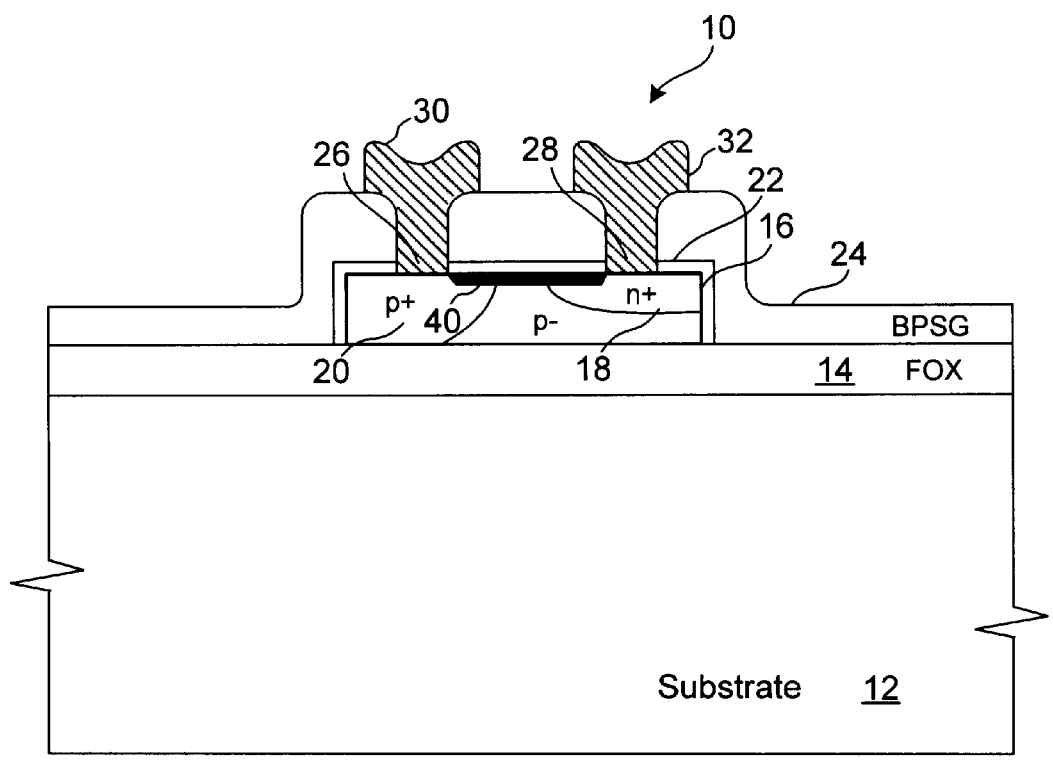
FIG. 6 illustrates the formation of a metal filament in the trim device of FIG. 3.

When trim device 10 is programmed or zapped, a low resistance path is formed between the cathode and anode terminals of the trim device. In some cases, metal electromigration between contacts 26 and 28 occurs to form a metal filament 40 between the two contacts, resulting in an electrical short connection between the two terminals of the trim device, as illustrated in FIG. 6 (note that the metal filament in FIG. 6 is not drawn to scale). The resultant electrical short connection usually has a resistance of 50 ohms or lower and typically has a resistance of about 10 ohms. For the purpose of forming a low resistance path between the anode and cathode terminals of trim device 10, it is not required that the metal filament or the metal sliver extends the entire distance from contact 26 to contact 28. In some cases, a metal sliver extending only partially from the anode contact to the cathode contact is sufficient to form the low resistance path. For instance, the metal sliver may extend from a contact (such as contact 26 to the p+ diffusion) to an opposite diffusion region across the p-n junction (such as n+ diffusion region 18).

In other cases, zap trimming of trim device 10 can merely increase the junction leakage current of the p-n junction diode. In these cases, the zap current or zap voltage is sufficient to induce damages to the p-n junction, thereby increasing the junction leakage, but not enough to cause a metal filament to form. The increase in leakage current between the anode and cathode terminals of the trim device can be sensed, such as by the use of an error amplifier. The error amplifier can generate a signal indicating when the leaking current has exceeded a predetermined threshold. The signal generated by the error amplifier can be used to drive a MOS transistor, for example, which is caused to turn on to form a low resistance path that can be used to effectuate a change in resistance in a trim circuit.

In accordance with the present invention, trim device 10 includes a p-n junction diode formed by n+ diffusion region 18 and p+ diffusion region 20 in polysilicon layer 16. When the spacing between the two diffusion regions is greater than zero, the diode has non-degenerate breakdown characteristics but can still have a small leakage current as formed. Therefore, the diode in trim device 10 is considered zener-like as the diode has a higher leakage current than the leakage current of a typical zener diode formed in bulk silicon. For example, in one case, a trim device of the present invention can have a forward bias leakage current of 360 nA while a zener diode built in bulk silicon will have a leakage current of only about 5–50 pA. However, the small leakage current of the zener-like diode built in polysilicon does not diminish the usefulness of the diode as a trim device. In most applications, a 2× or 3× increase in leakage current after zap is sufficient for a trim circuit to recognize the zener-like diode as being zapped. As discussed above, an error amplifier can be used to sense the increase in leakage current for the purpose of determining if the trim device has been zapped.

In other embodiments, after implantation-of the n+ and p+ regions, polysilicon layer 16 can be subjected to a rapid thermal anneal (RTA) process whereby the leakage characteristics of the p-n junction diode can be improved. For instance, the leakage level of the zener-like diode in polysilicon layer 16 can be reduced to a level commensurate with that of a zener diode built in bulk silicon. RTA processes are well known in the art and any conventional RTA processes can be used in the fabrication of trim device 10 for reducing the leakage level of the zener-like diode formed in the polysilicon layer.

Trim device 10 of the present invention has many advantages over conventional zener zap diodes. First, trim device 10 is capable of being zapped at very low current. It has been demonstrated that one version of trim device 10 can be zapped at as low as 5 mA at 11V in the reverse biased mode and another version of the trim device could be zapped at 8 mA at 6V in the reverse biased mode. Conventional trim devices often require at least 50 to 500 mA of zap current to induce a short condition. Thus, the trim device of the present invention requires between 10 to 100× less current to zap than conventional structures. The breakdown voltage of trim device 10 can be modified by adjusting the doping levels of the polysilicon layer in which trim device 10 is formed and the n+ and p+ regions forming the p-n junction diode. In some cases, the breakdown voltage of the trim device can be set to as low as 4.4 volts, in which case the trim device can be treated as open circuit only when the bias voltage applied to "read" the trim device is less than 4.4 volts.

Several factors contribute to the low zap current characteristics of the trim device of the present invention. First, the zener diode of the trim device of the present invention is built in a polysilicon layer and the zapping mechanism is metal electromigration along the grain structure of the polysilicon layer. In fact, it has been demonstrated that a metal sliver is formed between the two terminals of the trim device of the present invention when zapped. Although the metal transport mechanism of the trim device of the present invention is the same as conventional devices built in bulk silicon, the trim device of the present invention can be zapped at lower zap current because the grain boundaries of the polysilicon layer allow for easier metal transport than the single crystalline structure of the bulk silicon. Second, because the polysilicon layer is not in the bulk-silicon and instead is isolated between dielectric layers, the polysilicon layer can be heated up more readily to facilitate the metal electromigration process. In conventional trim devices built in bulk silicon, a much higher zap current is required because of thermal conduction of heat away from the zener diode junction into the silicon substrate.

In accordance with the present invention, the amount of zap current required to zap trim device 10 and the resulting voltage during zap is a function of the n+ to p+ spacing, the doping level of polysilicon layer 16, and the size and shape of metal contacts 26 and 28. For instance, increasing the width of metal contacts 26 and 28 decreases the resulting voltage across the device during zap. Also, the shape of the contacts can be modified to induce a more uniform filament so that zapping can occur more consistently, as will be described in more detail below. It may also be possible to further reduce the required zap current by using different shapes for n+ mask 17 and/or p+ mask 19.

Another advantage of the trim device of the present invention is that both reverse bias trim and forward bias trim can be carried out. In the present description, reverse bias trim refers to trimming by applying a positive voltage to the cathode terminal (n+ region 18) relative to the anode terminal (p+ region 20) of the trim device. Thus, the zener diode in polysilicon layer 16 is reversed biased until the p-n junction reaches a zener-like or avalanche breakdown. On the other hand, forward bias trim refers to trimming by applying a positive voltage to the anode terminal (p+ region 20) relative to the cathode terminal (n+ region 18) of the trim device. Of course, forward bias trim can also be carried out by applying a negative voltage to the cathode terminal (n+ region 18) relative to the anode terminal (p+ region 20) of the trim device. The zener diode is in forward bias mode and conducts a large amount current. The device is zapped when sufficient zap current is applied to cause metal electromigration between the metal contacts of the trim device.

Forward bias trim is more difficult in conventional zener diode trim devices built in bulk silicon because forward biasing the zener diode may turn on the parasitic bipolar transistor that the diode is a part of. However, the trim device of the present invention is built in a polysilicon layer isolated from the silicon substrate and other active devices in the integrated circuit. Therefore, forward bias trim can be carried out as no parasitic conduction is possible. By allowing the trim device to be zapped in both the forward bias mode and the reverse bias mode, the trim device of the present invention provides greater flexibility for designer of trim circuits. More importantly, it is a particular advantage to preclude any parasitic injection of current into the substrate during trim zapping since, in the case of after-assembly trim, the decoder circuitry needs to operate properly and not be disturbed or caused to latchup due to current injection from the trim device.

In operation, reverse bias trim requires low zap current but a higher resulting voltage across the trim device. Forward bias trim requires high zap current but zapping can occur at a lower resulting voltage across the trim device. Thus, the trim device can be operated in either the forward bias trim mode or the reverse bias trim mode depending on whether a lower zap current or a lower zap voltage is desired.

Another feature of the trim device of the present invention is that the trim device can be used as a zener-like trim device or a degenerate zener-like trim device by modifying the spacing between the n+ and p+ diffusion regions. Specifically, when the n+ to p+ spacing (denoted "d" in FIG. 2) is greater than zero, the p-n junction thus formed has non-degenerate characteristics. When the n+ to p+ spacing is zero or less then zero, that is, when the n+ and p+ diffusion regions are contiguous or overlapped, the p-n junction diode thus formed has degenerate or "leaky" characteristics. A degenerate trim device is useful when a zap current is applied to zap the trim device to cause an increase in leakage current, instead of forming a short connection. Usually, only a very low zap current is required to cause a sufficient increase in leakage between the anode and the cathode terminals of the trim device so that the trim device can be recognized as being shorted.

Lastly, because the trim device of the present invention can be zapped at very low zap current, the trim device is particularly useful for performing after-assembly trim where serial-register trimming is applied to limit the number of bond pads required. The low zap current property of the trim device of the present invention allows for the use of small decoding transistors in the trim circuit. Thus, an integrated circuit incorporating the trim device of the present invention can achieve a high level of precision and low cost.

Figure 4:
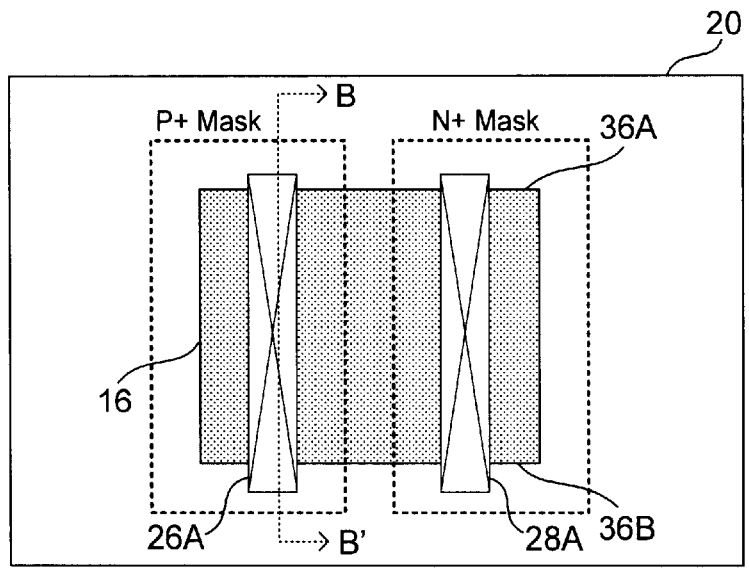
FIG. 4 is a top view of a zener-like trim device according to an alternate embodiment of the present invention.
Figure 5:
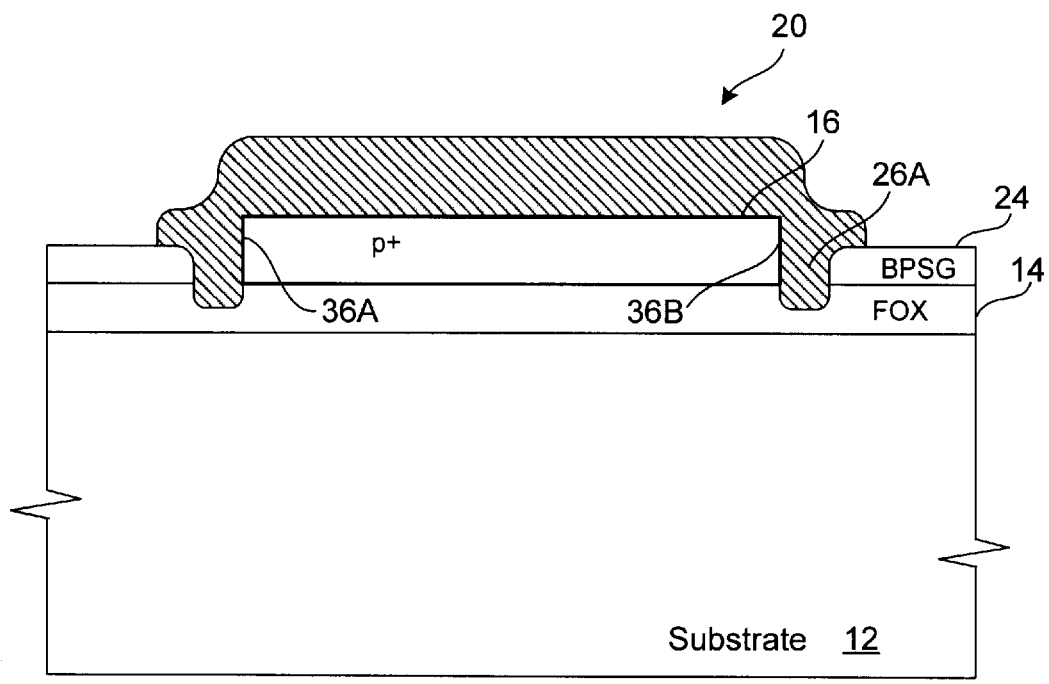
FIG. 5 is a cross-sectional view of the trim device in FIG. 4 along a line B–B'.

FIG. 4 is a top view of a zener-like trim device according to an alternate embodiment of the present invention. A cross-sectional view of the trim device in FIG. 4 along a line B–B' is shown in FIG. 5. Like elements in FIGS. 2–5 are given like reference numerals to simplify the discussion.

Trim device 20 of FIGS. 4 and 5 is built in the same manner as trim device 10 of FIGS. 2 and 3 except that trim device 20 includes over-sized contacts 26A and 28A. In particular, contacts 26A and 28A extend beyond the width of polysilicon layer 16. As shown in the cross-section in FIG. 5, when contact openings 26A is defined by etching of the BPSG layer, the BPSG layer at the two outside edges of polysilicon layer 16 is also removed. The opening of contact 26A also caused a portion of the field oxide layer to be etched. When metallization is formed in contact 26A, the metal interconnect makes electrical contacts with the sidewalls of the polysilicon layer as well as the top surface of the polysilicon layer. Trim device 20 has advantages over trim device 10 in that metal migration during zapping can occur along the sidewalls 36A and 36B of polysilicon layer 16. Thus, a even lower zap current is possible with trim device 20.

The above detailed descriptions are provided to illustrate specific embodiments of the present invention and are not intended to be limiting. Numerous modifications and variations within the scope of the present invention are possible. For instance, the n+ region in the polysilicon layer can be formed with a sharp point at an extreme pointing towards the p+ region. The sharp point acts to concentrate the electric field and define the location at which the p-n junction will first break down. Thus, a well defined break down characteristics can be achieved in the trim device that will help focus the path of the metal sliver which will form during trim zapping. The present invention is defined by the appended claims.

I claim:

1. A semiconductor device comprising:
   a polysilicon layer formed on the top surface of and electrically isolated from a semiconductor structure;
   a first region of a first conductivity type formed in the polysilicon layer, the first region being heavily doped;
   a second region of a second conductivity type formed in the polysilicon layer adjacent the first region, the second region being heavily doped, wherein the first region and the second region form zener-like diode in the polysilicon layer;
   a first metallization region in electrical contact with the first region; and
   a second metallization region in electrical contact with the second region,
   wherein a low resistance path is formed between the first metallization region and the second metallization region when a voltage or a current exceeding a predetermined threshold level is applied to a selected one of the first and the second region for zap trimming using the zener-like diode such that the low resistance path remains formed after the voltage or current exceeding the predetermined threshold level is no longer applied.

2. The semiconductor device of claim 1, wherein the voltage or current is applied for zap trimming of the zener-like diode where the voltage or current exceeding a predetermined threshold level, together with the resulting current or resulting voltage, provides power sufficient to cause the low resistance path to be formed.

3. The semiconductor device of claim 1, wherein the low resistance path comprises a conductive path between the first metallization region and the second metallization region, the conductive path having a resistance of about 50 ohms or less.

4. The semiconductor device of claim 3, wherein the conductive path comprises a metal filament formed in the polysilicon layer between the first metallization region and the second metallization region, the metal filament forming an electrical short connection between the first region and the second region.

5. The semiconductor device of claim 3, wherein the conductive path comprises a metal filament formed in the polysilicon layer and extending partially between the first metallization region and the second metallization region, the metal filament forming an electrical short connection between the first region and the second region.

6. The semiconductor device of claim 1, wherein the low resistance path comprises an increased leakage current in the zener-like diode as a result of the application of the voltage or the current to a selected one of the first region or the second region.

7. The semiconductor device of claim 6, wherein the zener-like diode has a first leakage current as formed and a second leakage current after application of the voltage or the current exceeding a predetermined threshold level, the second leakage current being two or more times larger than the first leakage current.

8. The semiconductor device of claim 1, wherein the semiconductor structure comprises:
   a dielectric layer formed on the top surface of a semiconductor substrate.

9. The semiconductor device of claim 8, wherein the dielectric layer comprises a field oxide layer.

10. The semiconductor device of claim 1, wherein the voltage or current is applied to the second region and comprises a positive voltage exceeding the breakdown voltage of the zener-like diode or a positive current whereby the resulting voltage across the zener-like diode exceeds the breakdown voltage of the zener-like diode.

11. The semiconductor device of claim 1, wherein the voltage or current is applied to the second region and comprises a negative voltage or current of sufficiently high magnitude to cause the low resistance path to be formed.

12. The semiconductor device of claim 1, wherein the voltage or current is applied to the first region and comprises a positive voltage or current of sufficiently high magnitude to cause the low resistance path to be formed.

13. The semiconductor device of claim 1, wherein the first region is spaced apart from the second region.

14. The semiconductor device of claim 1, wherein the first region and the second region is contiguous.

15. The semiconductor device of claim 1, wherein the first region and the second region overlaps at least partially, forming a degenerate p-n junction in the polysilicon layer.

16. The semiconductor device of claim 1, wherein the polysilicon layer comprises a lightly doped polysilicon layer of the first conductivity type.

17. The semiconductor device of claim 1, wherein the polysilicon layer comprises a lightly doped polysilicon layer of the second conductivity type.

18. The semiconductor device of claim 1, wherein the polysilicon layer comprises an undoped polysilicon layer.

19. The semiconductor device of claim 1, wherein the polysilicon layer comprises an amorphous polysilicon layer as deposited.

20. The semiconductor device of claim 1, wherein the polysilicon layer comprises a polycrystalline polysilicon layer as deposited.

21. The semiconductor device of claim 1, wherein the first conductivity type is p-type and the second conductivity type is n-type.

22. The semiconductor device of claim 1, wherein the polysilicon layer has a sheet resistivity of about 500 ohms/square.

23. The semiconductor device of claim 1, wherein the first region has a depth extending through the entire thickness of the polysilicon layer.

24. The semiconductor device of claim 1, wherein the first region has a depth extending partially into the polysilicon layer.

25. The semiconductor device of claim 1, wherein the second region has a depth extending partially into the polysilicon layer.

26. The semiconductor device of claim 1, further comprising:
  a dielectric layer overlying the polysilicon layer;
  a first contact opening in the dielectric layer formed on the top of the first region of the polysilicon layer; and
  a second contact opening in the dielectric layer formed on the top of the second region of the polysilicon layer,
  wherein the first metallization region is formed in the first contact and the second metallization region is formed in the second contact.

27. The semiconductor device of claim 26, wherein the polysilicon layer has a width and a length, and the first region and the second region are formed along the first length of the polysilicon layer, and wherein the first contact and the second contact each has a width that is greater than the width of the polysilicon layer.

28. A semiconductor device comprising:
  a dielectric layer formed on the top surface of a semiconductor substrate;
  a polysilicon layer formed on the top surface of the dielectric layer, the polysilicon layer being of a first conductivity type and lightly doped;
  a first region of the first-conductivity type formed in the polysilicon layer, the first region being heavily doped;
  a second region of a second conductivity type formed in the polysilicon layer adjacent the first region, the second region being heavily doped, wherein the first region and the second region form a zener-like diode;
  a first metallization region in electrical contact with the first region; and
  a second metallization region in electrical contact with the second region,
  wherein a low resistance path is formed between the first metallization region and the second metallization region when a voltage or a current exceeding a predetermined threshold level is applied to a selected one of the first and the second region for zap trimming using the zener-like diode such that the low resistance path remains formed after the voltage or current exceeding the predetermined threshold level is no longer applied.

29. The semiconductor device of claim 28, wherein the voltage or current is applied for zap trimming of the zener-like diode where the voltage or current exceeding a predetermined threshold level, together with the resulting current or resulting voltage, provides power sufficient to cause the low resistance path to be formed.

30. The semiconductor device of claim 28, wherein the voltage or current is applied to the second region and comprises a positive voltage exceeding the breakdown voltage of the zener-like diode or a positive current whereby the resulting voltage across the zener-like diode exceeds the breakdown voltage of the zener-like diode.

31. The semiconductor device of claim 28, wherein the voltage or current is applied to the second region and comprises a negative voltage or current of sufficiently high magnitude to cause the low resistance path to be formed.

32. The semiconductor device of claim 28, wherein the voltage or current is applied to the first region and comprises a positive voltage or current of sufficiently high magnitude to cause the low resistance path to be formed.

33. The semiconductor device of claim 28, wherein the polysilicon layer comprises an amorphous polysilicon layer as deposited.

34. The semiconductor device of claim 28, further comprising:
  a dielectric layer overlying the polysilicon layer;
  a first contact opening in the dielectric layer formed on the top of the first region of the polysilicon layer; and
  a second contact opening in the dielectric layer formed on the top of the second region of the polysilicon layer,
  wherein the first metallization region is formed in the first contact and the second metallization region is formed in the second contact.

35. The semiconductor device of claim 34, wherein the polysilicon layer has a width and a length, and the first region and the second region are formed along the first length of the polysilicon layer, and wherein the first contact and the second contact each has a width that is greater than the width of the polysilicon layer.

36. A method for forming a semiconductor device, comprising:
  forming a polysilicon layer on the top surface of a semiconductor structure, the polysilicon layer being electrically isolated from the semiconductor structure;
  forming a first region of a first conductivity type in the polysilicon layer, the first region being heavily doped;
  forming a second region of a second conductivity type in the polysilicon layer, the second region being heavily doped, wherein the first region and the second region form a zener-like diode;
  forming a dielectric layer overlying the polysilicon layer;
  forming a first contact opening to the first region of the polysilicon layer;

forming a second contact opening to the second region of the polysilicon layer;

forming a first metallization region in the first contact, the first metallization region in electrical contact with the first region; and forming a second metallization region in the second contact, the second metallization region in electrical contact with the second region, wherein a low resistance path is formed between the first metallization region and the second metallization region when a voltage or a current exceeding a predetermined threshold level is applied to a selected one of the first and the second region for zap trimming using the zener-like diode such that the low resistance path remains formed after the voltage or current exceeding the predetermined threshold level is no longer applied.

37. The method of claim 36, wherein the voltage or current is applied for zap trimming of the zener-like diode where the voltage or current exceeding a predetermined threshold level, together with the resulting current or resulting voltage, provides power sufficient to cause the low resistance path to be formed.

38. The method of claim 36, wherein before forming the polysilicon layer, the method further comprises:

forming a dielectric layer on the top surface of a semiconductor substrate, the dielectric layer and the semiconductor substrate forming the semiconductor structure.

39. The method of claim 38, wherein the dielectric layer comprises a field oxide layer.

40. The method of claim 36, wherein forming the polysilicon layer comprises:

forming a polysilicon layer of the first conductivity type and being lightly doped.

41. The method of claim 36, wherein forming the polysilicon layer comprises:

forming a polysilicon layer of the second conductivity type and being lightly doped.

42. The method of claim 36, wherein forming the polysilicon layer comprises:

depositing an amorphous polysilicon film; and patterning the amorphous polysilicon film to form the polysilicon layer.

43. The method of claim 36, wherein forming the polysilicon layer comprises:

depositing a polycrystalline polysilicon film; and patterning the polycrystalline polysilicon film to form the polysilicon layer.

* * * * *